(12) United States Patent
Jacobson et al.

(10) Patent No.: US 6,445,489 B1
(45) Date of Patent: Sep. 3, 2002

(54) ELECTROPHORETIC DISPLAYS AND SYSTEMS FOR ADDRESSING SUCH DISPLAYS

(75) Inventors: Joseph M. Jacobson, Newton Centre; Paul Drzaic, Lexington; Barrett Comiskey, Cambridge; Russell J. Wilcox, Natick; Ian Morrison, Acton, all of MA (US)

(73) Assignee: E Ink Corporation, Cambridge, MA (US)

( * ) Notice: Subject to any disclaimer, the term of this patent is extended or adjusted under 35 U.S.C. 154(b) by 0 days.

(21) Appl. No.: 09/272,716

(22) Filed: Mar. 18, 1999

Related U.S. Application Data
(60) Provisional application No. 60/078,363, filed on Mar. 18, 1998, and provisional application No. 60/090,232, filed on Jun. 22, 1998.

(51) Int. Cl.[7] .......................... G02B 26/00; G09G 3/34; B01D 57/02
(52) U.S. Cl. ..................... 359/296; 345/107; 204/450; 204/606
(58) Field of Search .................. 359/296; 345/105, 345/107, 108; 204/450, 600, 606

(56) References Cited

U.S. PATENT DOCUMENTS

| | | |
|---|---|---|
| 2,800,457 A | 7/1957 | Green et al. |
| 3,036,388 A | 5/1962 | Tate |
| 3,384,488 A | 5/1968 | Tulagin et al. |
| 3,406,363 A | 10/1968 | Tate |
| 3,460,248 A | 8/1969 | Tate |
| 3,585,381 A | 6/1971 | Hodson et al. |
| 3,612,758 A | 10/1971 | Evans et al. |
| 3,668,106 A | 6/1972 | Ota |
| 3,670,323 A | 6/1972 | Sobel et al. |
| 3,756,693 A | 9/1973 | Ota |
| 3,767,392 A | 10/1973 | Ota |
| 3,772,013 A | 11/1973 | Wells |

(List continued on next page.)

FOREIGN PATENT DOCUMENTS

| | | |
|---|---|---|
| DE | 44 31 441 C1 | 2/1996 |
| DE | 195 00 694 A1 | 8/1996 |
| EP | 0 186 710 A1 | 7/1986 |
| EP | 0 323 656 B1 | 7/1987 |
| EP | 0 240 063 B1 | 10/1987 |
| EP | 0 268 877 A2 | 6/1988 |
| EP | 0 281 204 A2 | 9/1988 |
| EP | 0 325 013 A1 | 7/1989 |
| EP | 0 325 013 B1 | 7/1989 |
| EP | 0 344 367 B1 | 12/1989 |

(List continued on next page.)

OTHER PUBLICATIONS

Microencapsulation: Processes and Applications, Jan. E. Vandegaer, ed., American Chemical Society Symposium, Chicago, IL, 1973, pp. v–x, 1–180 (published by Plenum Press, New York, 1974).

Dabbousi et al., "Electroluminescence from CdSe Quantun–dot/Polymer Composites," *Applied Physics Letters*, 1995, vol. 66, No. 11, (pp. 1316–1318).

(List continued on next page.)

*Primary Examiner*—Loha Ben
(74) *Attorney, Agent, or Firm*—Testa, Hurwitz & Thibeault, LLP

(57) ABSTRACT

Electrophoretic displays include a light-emitting layer, a photoconductive layer, and an electrophoretic layer. The light-emitting layer may be an organic, light-emitting material, or organic, light-emitting diode, which is addressable using a multiplex addressing drive scheme. The impedance of the photoconductive layer is lowered when struck by light from the light-emitting layer. As a result of the lowered impedance of the photoconductive layer, the electrophoretic layer, which itself cannot be multiplexed, is addressed at a lower, subthreshold voltage.

42 Claims, 5 Drawing Sheets

U.S. PATENT DOCUMENTS

| | | | |
|---|---|---|---|
| 3,792,308 A | 2/1974 | Ota | |
| 3,806,893 A | 4/1974 | Ohnishi et al. | |
| 3,850,627 A | 11/1974 | Wells et al. | |
| 3,870,517 A | 3/1975 | Ota et al. | |
| 3,892,568 A | 7/1975 | Ota | |
| 3,909,116 A | 9/1975 | Kohashi | |
| 3,922,255 A | 11/1975 | Koestler et al. | |
| 3,972,040 A | 7/1976 | Hilsum et al. | |
| 4,001,140 A | 1/1977 | Foris et al. | |
| 4,041,481 A | 8/1977 | Sato | |
| 4,045,327 A | 8/1977 | Noma et al. | |
| 4,062,009 A | 12/1977 | Raverdy et al. | |
| 4,068,927 A | 1/1978 | White | |
| 4,071,430 A | 1/1978 | Liebert | |
| 4,087,376 A | 5/1978 | Foris et al. | |
| 4,088,395 A | 5/1978 | Giglia | |
| 4,093,534 A | 6/1978 | Carter et al. | |
| 4,123,346 A | 10/1978 | Ploix | |
| 4,126,528 A | 11/1978 | Chiang | |
| 4,126,854 A | 11/1978 | Sheridon | |
| 4,143,103 A | 3/1979 | Sheridon | |
| 4,143,472 A | 3/1979 | Murata et al. | |
| 4,147,932 A | 4/1979 | Lewis | |
| 4,149,149 A | 4/1979 | Miki et al. | |
| 4,166,800 A | 9/1979 | Fong | |
| 4,201,691 A | 5/1980 | Asher et al. | |
| 4,203,106 A | 5/1980 | Dalisa et al. | |
| 4,211,668 A | 7/1980 | Tate | |
| 4,218,302 A | 8/1980 | Dalisa et al. | |
| 4,231,641 A | 11/1980 | Randin | |
| 4,261,653 A | 4/1981 | Goodrich | |
| 4,272,596 A | 6/1981 | Harbour et al. | |
| 4,273,672 A | 6/1981 | Vassiliades | |
| 4,285,801 A | 8/1981 | Chiang | |
| 4,298,448 A | 11/1981 | Müller et al. | |
| 4,305,807 A | 12/1981 | Somlyody | |
| 4,311,361 A | 1/1982 | Somlyody | |
| 4,314,013 A | 2/1982 | Chang | |
| 4,324,456 A | 4/1982 | Dalissa | |
| 4,368,952 A | 1/1983 | Murata et al. | |
| 4,390,403 A | 6/1983 | Batchelder | |
| 4,418,346 A | 11/1983 | Batchelder | |
| 4,419,383 A | 12/1983 | Lee | |
| 4,430,648 A | 2/1984 | Togashi et al. | |
| 4,438,160 A | 3/1984 | Ishikawa et al. | |
| 4,439,507 A | 3/1984 | Pan et al. | |
| 4,444,961 A | 4/1984 | Timm | |
| 4,450,440 A | 5/1984 | White | |
| 4,502,934 A | 3/1985 | Gazard et al. | |
| 4,522,472 A | 6/1985 | Liebert et al. | |
| 4,543,306 A | 9/1985 | Dubois et al. | |
| 4,598,960 A | 7/1986 | DiSanto et al. | |
| 4,605,284 A | 8/1986 | Fergason | |
| 4,620,916 A | 11/1986 | Zwemer et al. | |
| 4,623,706 A | 11/1986 | Timm et al. | |
| 4,643,528 A | 2/1987 | Bell, Jr. | |
| 4,648,956 A * | 3/1987 | Marshall et al. | 359/296 |
| 4,655,897 A | 4/1987 | DiSanto et al. | |
| 4,666,673 A | 5/1987 | Timm | |
| 4,686,524 A * | 8/1987 | White | 359/296 |
| 4,707,080 A | 11/1987 | Fergason | |
| 4,726,662 A | 2/1988 | Cromack | |
| 4,732,830 A | 3/1988 | DiSanto et al. | |
| 4,741,604 A | 5/1988 | Kornfeld | |
| 4,742,345 A | 5/1988 | DiSanto et al. | |
| 4,746,917 A | 5/1988 | DiSanto et al. | |
| 4,748,366 A | 5/1988 | Taylor | |
| 4,772,102 A | 9/1988 | Fergason et al. | |
| 4,824,208 A | 4/1989 | Fergason et al. | |
| 4,832,458 A | 5/1989 | Fergason et al. | |
| 4,833,464 A | 5/1989 | DiSanto et al. | |
| 4,846,931 A | 7/1989 | Gmitter et al. | 156/633 |
| 4,850,919 A | 7/1989 | DiSanto et al. | |
| 4,883,561 A | 11/1989 | Gmitter et al. | 156/633 |
| 4,889,603 A | 12/1989 | DiSanto et al. | |
| 4,891,245 A | 1/1990 | Micale | |
| 4,892,607 A | 1/1990 | DiSanto et al. | |
| 4,909,959 A | 3/1990 | Lemaire et al. | |
| 4,919,521 A | 4/1990 | Tada et al. | |
| 4,931,019 A | 6/1990 | Park | |
| 4,947,159 A | 8/1990 | DiSanto et al. | |
| 4,947,219 A | 8/1990 | Boehm | |
| 5,009,490 A | 4/1991 | Kouno et al. | |
| 5,017,225 A | 5/1991 | Nakanishi et al. | |
| 5,028,841 A | 7/1991 | DiSanto et al. | |
| 5,041,824 A | 8/1991 | DiSanto et al. | |
| 5,053,763 A | 10/1991 | DiSanto et al. | |
| 5,057,363 A | 10/1991 | Nakanishi | |
| 5,059,694 A | 10/1991 | Delabouglise et al. | |
| 5,066,105 A | 11/1991 | Yoshimoto et al. | |
| 5,066,559 A | 11/1991 | Elmasry et al. | |
| 5,066,946 A | 11/1991 | DiSanto et al. | |
| 5,070,326 A | 12/1991 | Yoshimoto et al. | |
| 5,077,157 A | 12/1991 | DiSanto et al. | |
| 5,082,351 A | 1/1992 | Fergason | |
| 5,105,185 A | 4/1992 | Nakanowatari et al. | |
| 5,128,226 A | 7/1992 | Hung | 430/58 |
| 5,128,266 A | 7/1992 | Hung | 430/58 |
| 5,128,785 A | 7/1992 | Yoshimoto et al. | |
| 5,132,049 A | 7/1992 | Garreau et al. | |
| 5,138,472 A | 8/1992 | Jones et al. | |
| 5,149,826 A | 9/1992 | Delabouglise et al. | |
| 5,151,032 A | 9/1992 | Igawa | |
| 5,161,007 A | 11/1992 | Takanashi et al. | |
| 5,174,882 A | 12/1992 | DiSanto et al. | |
| 5,177,476 A | 1/1993 | DiSanto et al. | |
| 5,185,226 A | 2/1993 | Grosso et al. | |
| 5,187,609 A | 2/1993 | DiSanto et al. | |
| 5,194,852 A | 3/1993 | More et al. | |
| 5,204,424 A | 4/1993 | Roncali et al. | |
| 5,216,416 A | 6/1993 | DiSanto et al. | |
| 5,216,530 A | 6/1993 | Pearlman et al. | 359/43 |
| 5,220,316 A | 6/1993 | Kazan | |
| 5,223,115 A | 6/1993 | DiSanto et al. | |
| 5,223,823 A | 6/1993 | DiSanto et al. | |
| 5,247,290 A | 9/1993 | DiSanto et al. | |
| 5,250,932 A | 10/1993 | Yoshimoto et al. | |
| 5,250,938 A | 10/1993 | DiSanto et al. | |
| 5,254,981 A | 10/1993 | DiSanto et al. | |
| 5,262,098 A | 11/1993 | Crowley et al. | |
| 5,266,098 A | 11/1993 | Chun et al. | |
| 5,266,937 A | 11/1993 | DiSanto et al. | |
| 5,268,448 A | 12/1993 | Buechner et al. | |
| 5,270,843 A | 12/1993 | Wang | |
| 5,276,113 A | 1/1994 | Hashiguchi et al. | |
| 5,276,438 A | 1/1994 | DiSanto et al. | |
| 5,279,511 A | 1/1994 | DiSanto et al. | |
| 5,279,694 A | 1/1994 | DiSanto et al. | |
| 5,293,528 A | 3/1994 | DiSanto et al. | |
| 5,296,974 A | 3/1994 | Tada et al. | |
| 5,298,833 A | 3/1994 | Hou | |
| 5,302,235 A | 4/1994 | DiSanto et al. | |
| 5,303,073 A | 4/1994 | Shirota et al. | |
| 5,304,439 A | 4/1994 | Disanto et al. | |
| 5,315,312 A | 5/1994 | DiSanto et al. | |
| 5,326,484 A | 7/1994 | Nakashima et al. | |
| 5,344,594 A | 9/1994 | Sheridon | |
| 5,345,251 A | 9/1994 | DiSanto et al. | |
| 5,359,346 A | 10/1994 | DiSanto et al. | |
| 5,360,689 A | 11/1994 | Hou et al. | |
| 5,362,671 A | 11/1994 | Zavracky et al. | 437/81 |

| Patent | Date | Inventor |
|---|---|---|
| 5,380,362 A | 1/1995 | Schubert |
| 5,383,008 A | 1/1995 | Sheridon |
| 5,389,945 A | 2/1995 | Sheridon |
| 5,402,145 A | 3/1995 | DiSanto et al. |
| 5,403,518 A | 4/1995 | Schubert |
| 5,411,398 A | 5/1995 | Nakanishi et al. |
| 5,411,656 A | 5/1995 | Schubert |
| 5,412,398 A | 5/1995 | DiSanto et al. |
| 5,421,926 A | 6/1995 | Yukinobu et al. |
| 5,460,688 A | 10/1995 | DiSanto et al. |
| 5,463,492 A | 10/1995 | Check |
| 5,467,107 A | 11/1995 | DiSanto et al. |
| 5,498,674 A | 3/1996 | Hou et al. |
| 5,499,038 A | 3/1996 | DiSanto et al. |
| 5,508,068 A | 4/1996 | Nakano |
| 5,508,720 A | 4/1996 | DiSanto et al. |
| 5,512,162 A | 4/1996 | Sachs et al. |
| 5,543,177 A | 8/1996 | Morrison et al. |
| 5,543,219 A | 8/1996 | Elwakil |
| 5,545,291 A | 8/1996 | Smith et al. |
| 5,552,679 A | 9/1996 | Murasko |
| 5,556,583 A | 9/1996 | Tashiro et al. |
| 5,561,443 A | 10/1996 | DiSanto et al. |
| 5,565,885 A | 10/1996 | Tamanoi |
| 5,573,711 A | 11/1996 | Hou et al. |
| 5,575,554 A | 11/1996 | Guritz |
| 5,582,700 A | 12/1996 | Bryning et al. |
| 5,583,675 A | 12/1996 | Yamada et al. ............... 349/84 |
| 5,597,889 A | 1/1997 | Takimoto et al. |
| 5,602,572 A | 2/1997 | Rylander |
| 5,604,027 A | 2/1997 | Sheridon |
| 5,604,070 A | 2/1997 | Rao et al. |
| 5,609,978 A | 3/1997 | Giorgianni et al. |
| 5,610,455 A | 3/1997 | Allen et al. |
| 5,614,340 A | 3/1997 | Bugner et al. |
| 5,623,585 A | 4/1997 | Matias et al. |
| 5,625,460 A | 4/1997 | Tai |
| 5,627,561 A | 5/1997 | Laspina et al. |
| 5,635,317 A | 6/1997 | Taniguchi et al. |
| 5,638,103 A | 6/1997 | Obata et al. |
| 5,639,914 A | 6/1997 | Tomiyama et al. |
| 5,643,506 A | 7/1997 | Rourke |
| 5,643,673 A | 7/1997 | Hou |
| 5,648,801 A | 7/1997 | Beardsley et al. |
| 5,650,247 A | 7/1997 | Taniguchi et al. |
| 5,650,872 A | 7/1997 | Saxe et al. |
| 5,654,367 A | 8/1997 | Takimoto et al. |
| 5,663,224 A | 9/1997 | Emmons et al. |
| 5,672,381 A | 9/1997 | Rajan |
| 5,673,148 A | 9/1997 | Morris et al. |
| 5,675,719 A | 10/1997 | Matais et al. |
| 5,676,884 A | 10/1997 | Tiers et al. |
| 5,684,501 A | 11/1997 | Knapp et al. |
| 5,686,383 A | 11/1997 | Long et al. |
| 5,689,282 A | 11/1997 | Wolfs et al. |
| 5,691,098 A | 11/1997 | Busman et al. |
| 5,693,442 A | 12/1997 | Weiss et al. |
| 5,694,224 A | 12/1997 | Tai |
| 5,699,102 A | 12/1997 | Ng et al. |
| 5,707,738 A | 1/1998 | Hou |
| 5,707,747 A | 1/1998 | Tomiyama et al. |
| 5,708,525 A | 1/1998 | Sheridon |
| 5,709,976 A | 1/1998 | Malhotra |
| 5,714,051 A | 2/1998 | Van Leth et al. |
| 5,714,270 A | 2/1998 | Malhotra et al. |
| 5,715,511 A | 2/1998 | Aslam et al. |
| 5,715,514 A | 2/1998 | Williams et al. |
| 5,716,550 A | 2/1998 | Gardner et al. |
| 5,717,283 A | 2/1998 | Biegelsen et al. |
| 5,717,514 A | 2/1998 | Sheridon |
| 5,717,515 A | 2/1998 | Sheridon |
| 5,718,996 A | 2/1998 | Iijima et al. |
| 5,721,042 A | 2/1998 | Iijima et al. |
| 5,725,935 A | 3/1998 | Rajan |
| 5,729,632 A | 3/1998 | Tai |
| 5,729,663 A | 3/1998 | Lin et al. |
| 5,731,116 A | 3/1998 | Matsuo et al. |
| 5,737,115 A | 4/1998 | Mackinlay et al. |
| 5,738,977 A | 4/1998 | Van Der Sluis-Van Der Voort et al. |
| 5,739,801 A | 4/1998 | Sheridon |
| 5,740,495 A | 4/1998 | Maher et al. |
| 5,744,283 A | 4/1998 | Spierings et al. |
| 5,745,094 A | 4/1998 | Gordon, II et al. |
| 5,750,238 A | 5/1998 | Iijima et al. |
| 5,751,268 A | 5/1998 | Sheridon |
| 5,753,763 A | 5/1998 | Rao et al. |
| 5,754,332 A | 5/1998 | Crowley |
| 5,759,671 A | 6/1998 | Tanaka et al. |
| 5,760,761 A | 6/1998 | Sheridon |
| 5,767,826 A | 6/1998 | Sheridon et al. |
| 5,777,782 A | 7/1998 | Sheridon |
| 5,783,614 A | 7/1998 | Chen et al. |
| 5,783,856 A | 7/1998 | Smith et al. |
| 5,786,875 A | 7/1998 | Brader et al. |
| 5,808,783 A | 9/1998 | Crowley |
| 5,824,186 A | 10/1998 | Smith et al. |
| 5,825,529 A | 10/1998 | Crowley |
| 5,828,432 A | 10/1998 | Shashidhar et al. |
| 5,843,259 A | 12/1998 | Narang et al. |
| 5,900,858 A | 5/1999 | Richley |
| 5,904,545 A | 5/1999 | Smith et al. |
| 5,914,806 A | 6/1999 | Gordon, II et al. |
| 5,930,026 A | 7/1999 | Jacobson et al. |
| 5,961,804 A * | 10/1999 | Jacobson et al. ........... 204/906 |
| 5,969,376 A | 10/1999 | Bao |
| 6,005,791 A | 12/1999 | Gudesen et al. ............. 365/114 |
| 6,005,817 A | 12/1999 | Gudesen et al. ............. 365/215 |
| 6,014,247 A | 1/2000 | Winter et al. ................ 359/296 |
| 6,184,856 B1 * | 2/2001 | Gordon, II et al. ......... 345/107 |

FOREIGN PATENT DOCUMENTS

| | | |
|---|---|---|
| EP | 0 344 367 A1 | 12/1989 |
| EP | 0 361 420 A2 | 4/1990 |
| EP | 0 362 928 A1 | 4/1990 |
| EP | 0 363 030 B1 | 4/1990 |
| EP | 0 363 030 A2 | 4/1990 |
| EP | 0 375 005 B1 | 6/1990 |
| EP | 0 396 247 B1 * | 11/1990 |
| EP | 0 396 247 A2 * | 11/1990 |
| EP | 0 396 937 A2 * | 11/1990 |
| EP | 0 404 545 A2 * | 12/1990 |
| EP | 0 408 105 B1 * | 1/1991 |
| EP | 0 442 123 A1 * | 8/1991 |
| EP | 0 443 571 A2 * | 8/1991 |
| EP | 0 448 853 A1 * | 10/1991 |
| EP | 0 448 853 B1 * | 10/1991 |
| EP | 0 460 747 A2 | 12/1991 |
| EP | 0 525 852 B1 * | 2/1993 |
| EP | 0 525 852 A1 * | 2/1993 |
| EP | 0 540 281 A2 * | 5/1993 |
| EP | 0 570 995 B1 * | 11/1993 |
| EP | 0 570 995 A1 * | 11/1993 |
| EP | 0 575 475 B1 * | 12/1993 |
| EP | 0 586 373 B1 * | 3/1994 |
| EP | 0 586 545 B1 * | 3/1994 |
| EP | 0 595 812 B1 * | 5/1994 |
| EP | 0 601 072 B1 * | 6/1994 |
| EP | 0 601 075 B1 * | 6/1994 |
| EP | 0 604 423 B1 * | 7/1994 |
| EP | 0 618 715 A1 * | 10/1994 |
| EP | 0 684 579 A2 * | 11/1995 |
| EP | 0 721 176 A2 * | 7/1996 |

| | | |
|---|---|---|
| EP | 0 721 176 A3 * | 7/1996 |
| EP | 0 924 551 A1 * | 6/1999 |
| FR | 2693005 | 12/1993 |
| GB | 1 314 906 | 4/1973 |
| GB | 1 465 701 | 3/1977 |
| GB | 2 044 508 A | 10/1980 |
| GB | 2 149 548 A | 6/1985 |
| GB | 2292119 A | 2/1996 |
| GB | 2 306 229 A | 4/1997 |
| GB | 2324273 A | 10/1998 |
| JP | 53-73098 | 6/1978 |
| JP | 54111368 | 8/1979 |
| JP | 55096922 | 7/1980 |
| JP | 59098227 | 6/1984 |
| JP | 60189731 | 9/1985 |
| JP | 62058222 | 3/1987 |
| JP | 62231930 | 10/1987 |
| JP | 62269124 | 11/1987 |
| JP | 62299824 | 12/1987 |
| JP | 01086116 | 3/1989 |
| JP | 01086117 A | 3/1989 |
| JP | 01086118 | 3/1989 |
| JP | 64 86116 | 3/1989 |
| JP | 01142537 A | 6/1989 |
| JP | 01177517 | 7/1989 |
| JP | 01248182 A | 10/1989 |
| JP | 01267525 | 10/1989 |
| JP | 02223934 A | 9/1990 |
| JP | 02223935 A | 9/1990 |
| JP | 02223936 A | 9/1990 |
| JP | 02284124 A | 11/1990 |
| JP | 02284125 A | 11/1990 |
| JP | 5-61421 | 3/1993 |
| JP | 05165064 A | 6/1993 |
| JP | 05173194 A | 7/1993 |
| JP | 05307197 A | 11/1993 |
| JP | 6089081 | 3/1994 |
| JP | 6-202168 | 7/1994 |
| JP | 07036020 | 2/1995 |
| JP | 2551783 | 8/1996 |
| JP | 08234176 | 9/1996 |
| JP | 9-6277 | 1/1997 |
| JP | 950181574 | 2/1997 |
| JP | 9-185087 | 7/1997 |
| JP | 9-211499 | 8/1997 |
| JP | 09230391 | 9/1997 |
| JP | 10-48673 | 2/1998 |
| JP | 10072571 A | 3/1998 |
| JP | 10-149118 A | 6/1998 |
| JP | 10-161161 | 6/1998 |
| JP | 11202804 A | 7/1999 |
| JP | 11212499 | 8/1999 |
| JP | 11219135 | 8/1999 |
| WO | WO 82/02961 | 9/1982 |
| WO | WO 92/12453 | 7/1992 |
| WO | WO 92/17873 | 10/1992 |
| WO | WO 92/20060 | 11/1992 |
| WO | WO 92/21733 | 12/1992 |
| WO | WO 93/02443 | 2/1993 |
| WO | WO 93/04458 | 3/1993 |
| WO | WO 93/04459 | 3/1993 |
| WO | WO 93/05425 | 3/1993 |
| WO | WO 93/07608 | 4/1993 |
| WO | WO 93/17414 | 9/1993 |
| WO | WO 93/18428 | 9/1993 |
| WO | WO 94/24236 | 10/1994 |
| WO | WO 95/02636 | 1/1995 |
| WO | WO 95/05622 | 2/1995 |
| WO | WO 95/06307 | 3/1995 |
| WO | WO 95/07527 | 3/1995 |
| WO | WO 95/10107 | 4/1995 |
| WO | WO 95/15363 | 6/1995 |
| WO | WO 95/19227 | 7/1995 |
| WO | WO 95/22085 | 8/1995 |
| WO | WO 95/27924 | 10/1995 |
| WO | WO 95/33085 | 12/1995 |
| WO | WO 96/41372 | 12/1996 |
| WO | WO 97/01165 | 1/1997 |
| WO | WO 97/01166 | 1/1997 |
| WO | WO 97/01171 | 1/1997 |
| WO | WO 97/04398 | 2/1997 |
| WO | WO 97/20274 | 6/1997 |
| WO | WO 97/24715 | 7/1997 |
| WO | WO 97/24907 | 7/1997 |
| WO | WO 97/35298 | 9/1997 |
| WO | WO 97/48009 | 12/1997 |
| WO | WO 97/49125 | 12/1997 |
| WO | WO 98/03896 | 1/1998 |
| WO | WO 98/19208 | 5/1998 |
| WO | WO 98/41898 | 9/1998 |
| WO | WO 98/41899 | 9/1998 |
| WO | WO 98/55897 | 12/1998 |
| WO | WO 98/58383 | 12/1998 |
| WO | WO 99/10767 | 3/1999 |
| WO | WO 99/10768 | 3/1999 |
| WO | WO 99/10769 | 3/1999 |
| WO | WO 99/12170 | 3/1999 |
| WO | WO 99/20682 | 4/1999 |
| WO | WO 99/26419 | 5/1999 |
| WO | WO 99/40631 | 8/1999 |
| WO | WO 99/41732 | 8/1999 |
| WO | WO 99/41787 | 8/1999 |
| WO | WO 99/41788 | 8/1999 |
| WO | WO 99/44229 | 9/1999 |
| WO | WO 99/45416 | 9/1999 |
| WO | WO 99/45582 | 9/1999 |
| WO | WO 99/47970 | 9/1999 |
| WO | WO 99/53371 | 10/1999 |
| WO | WO 99/56171 | 11/1999 |
| WO | WO 99/63527 | 12/1999 |
| WO | WO 99/65011 | 12/1999 |
| WO | WO 99/65012 | 12/1999 |

OTHER PUBLICATIONS

Huang et al., "Photoluminescence and Electroluminescence of ZnS:Cu Nanocrystals in Polymeric Networks," *Applied Physics Letters,* 1997, vol. 70, No. 18, (pp. 2335–2337).

Nakamura et al., "Development of Electrophoretic Display Using Microcapsulated Suspension," *1998 ISD International Symposium Digest of Technical Papers, vol. 29, Proceedings of SID '98 International Symposium,* May 1998, pp. 1014–1017.

Ridley et al., "All–Inorganic Field Effect Transistors Fabricated by Printing," *Science,* vol. 286, Oct. 22, 1999, pp. 746–748.

"Capsule Wall Treatment," *Microcapsules and Microencapsulation Techniques* (pp. 156–177) date unknown.

"Pigments and Paints," *Microcapsules and Microencapsulation Techniques,* (pp. 178–193) date unknown.

Sankus, "Electrophoretic Display Cell," *Xerox Disclosure Journal,* May/Jun. 1979, vol. 4, No. 3, (p. 309).

"Microencapsulation with Synthetic Polymeric Film Formers," *Microcapsules and Microencapsulation Techniques,* (pp. 65–130).

Platt, "Digital Ink," *Wired,* May 1997, (pp. 152, 208–210).

Ackerman, "E Ink of Cambridge Gets Start–Up Funding," Dec. 1997.

Ballinger, "Magnetic Recording Paper is Erasable," *Electronics,* Mar. 1973, (pp. 73–76).

Beilin et al., "8.5: 2000–Character Electrophoretic Display," *SID 86 Digest,* 1986, (pp. 136–140).

Blazo, "10.1/9:00 A.M.: High Resolution Electrophoretic Display with Photoconductor Addressing," *SID 82 Digest,* 1982, (pp. 92–93).

Bohnke et al., "Polymer–Based Solid Electrochronic Cell for Matrix–Addressable Display Devices," *J. Electrochem Soc.,* Dec. 1991, vol. 138, No. 12, (pp. 3612–3617).

Kenward (1999), "Displaying a Winning Glow," *Technology Review,* 69–73.

Bryce, "Seeing Through Synthetic Metals," *Nature,* Sep. 1988, vol. 335, No. 1, (pp. 12–13).

Chiang, "Conduction Mechanism of Charge Control Agents Used in Electrophretic Display Devices," *Proceedings of the S.I.D.,* 1977, vol. 18, Nos. 3 & 4, (pp. 275–282).

Chiang et al., "11.5/4:10 P.M.: A High Speed Electrophoretic Matrix Display," *SID 80 Digest,* 1980, (pp. 114–115).

Clarisse et al., "Field–Effect Transistor With Diphthalocyanine Thin Film," *Electronics Letters,* May 1988, (pp. 674–675).

Comiskey et al., "7.4L: Late–News Paper: Electrophoretic Ink: A Printable Display Material," *SID 97 Digest,* 1997, (pp. 75–76).

Croucher et al., "Electrophoretic Display: Materials as Related to Performance," *Photographic Science and Engineering,* Mar./Apr. 1981, vol. 25, No. 2, (pp. 80–86).

Dalisa, "Electrophoretic Display Technology," *Transactions on Electron Devices,* Jul. 1977, vol. 24, No. 7, (pp. 827–834).

Egashira et al., "A Solid Electrochromic Cell Consisting of LU–Diphthalocyanine and Lead Fluoride," *Proceedings of the SID,* 1987, vol. 28, No. 3, (pp. 227–232).

Fitzhenry, "Optical Effects of Adsorption of Dyes on Pigment Used in Electrophoretic Image Displays," *Applied Optics,* Oct. 1979, vol. 18, No. 19, (pp. 3332–3337).

Fitzhenry, "Optical Properties of Electrophoretic Image Displays," *Proceedings of the SID,* 1981, vol. 22, No. 4, (pp. 300–309).

Goodman, "Passive Liquid Displays: Liquid Crystals, Electrophoretics, and Electrochromics," *Proceeding of the SID,* 1976, vol. 17, No. 1, (pp. 30–38).

Gutcho, "Additional Uses for Encapsulated Products," *Microencapsules and Microencapsulation Techniques,* (pp. 278–343) date unknown.

Hatano et al., "18.3: Bistable Paper–White Display Device Using Cholesteric Liquid Crystals," *SID 96 Digest,* 1996, (pp. 269–272).

Hosaka et al., "Electromagnetic Microrelays: Concepts and Fundamental Characteristics," *Sensors and Actuators,* 1994, vol. 40, (pp. 41–47).

Howe, "MIT Book Would Bind Computer "Ink" to Paper," *Boston Globe,* 1996, (pp. 31 & 35).

Ji et al., "P–50: Polymer Walls in Higher–Polymer–Content Bistable Reflective Cholesteric Displays," *SID 96 Digest,* (pp. 611–613).

Jin et al., "Optically Transparent, Electrically Conductive Composite Medium," *Science,* 1992, (pp. 446–448).

Kornfield, "9.5: A Defect–Tolerant Active–Matrix Electrophoretic Display," *SID 84 Digest,* 1984, (pp. 142–144).

Lewis, "Gravitational, Inter–Particle and Particle–Electrode Forces in the Electrophoretic Display," *Proceeding of the SID,* 1977, vol. 18, Nos. 3 & 4 (pp. 235–242).

Moesner et al., "Devices for Particle Handling by an AC Electric Field," *Proceedings of the IEEE,* 1995, (pp. 66–69).

Murau, "9.4: Characteristics of an X–Y Addressed Electrophoretic Image Display (EPID)," *SID 84 Digest,* 1984, (p. 141).

Mürau et al., "The Understanding and Elimination of Some Suspension Instabilities in a Electrophoretic Display," *J. Appl. Phys.,* Sep. 1978, vol. 49, No. 9 (pp. 4820–4829).

Mürau et al., "7.6/4:40 P.M.: An Electrophoretic Radiographic Device," *SID 79 Digest,* 1979, (pp. 46–47).

Vaz et al., "Dual Frequency Addressing of Polymer–Dispersed Liquid–Crystal Films," *J. Appl. Phys.,* Jun. 1989, vol. 65, No. 12, (pp. 5043–5050).

Ota et al., "Developments in Electrophoretic Displays," *Proceedings of the SID,* 1977, vol. 18, Nos. 3 & 4, (pp. 243–254).

Ota et al., "Electrophoretic Display Devices," *Laser 75 Optoelectronics Conference Proceedings,* (pp. 145–148).

Ota et al., "Electrophoretic Image Display," *Proceedings of the IEEE,* Jul. 1973, (pp. 832–836).

Ziemells, "Putting it on Plastic," *Nature,* Jun. 1998, vol. 393, (pp. 619–620).

Pankove, "Color Reflection Types Display Panel," *RCA Technical Notes,* Mar. 1962, No. 535, (2 sheets).

Pearlstein, "Electroless Plating," *Modern,* (pp. 710–747) date unknown.

Saitoh et al., "A Newly Developed Electrical Twisting Ball Display," *Proceedings of the SID,* 1982 vol. 23, No. 4, (pp. 249–253).

"E Ink Debuts in J.C. Penney Stores," *Boston Herald,* May 1999, (p. 27).

Sheridon et al., "The Gyricon—A Twisting Ball Display," *Proceeding of the SID,* 1977, vol. 18, Nos. 3 & 4, (pp. 289–293).

Sheridon et al., "10.2/9:25 A.M.: A Photoconductor–Addressed Electrophoretic Cell for Office Data Display," *SID 82 Digest,* 1982, (pp. 94–95).

Shiffman et al., "An Electrophoretic Display with Internal NMOS Address Logic and Display Drivers," *Proceedings of the SID,* 1984, vol. 25, No. 2, (pp. 105–115).

Shiwa et al., "5.6: Electrophoretic Display Method Using Ionographic Techonology, " *SID 888 Digest,* 1988, (pp. 61–62).

Singer et al., "An X–Y Addressable Electrophoretic Display," *Proceedings of the SID,* 1977, vol. 18, Nos. 3 & 4, (pp. 255–266).

"Electronic Book is a Whole Library," *Sunday Times Newspaper,* Feb. 1996.

Vance, "Optical Characteristics of Electrophoretic Displays," *Proceeding of the SID,* 1977, vol. 18, Nos. 3 & 4, (pp. 267–274).

Vizard, "Electric Tales Computer Chips Replace Wood Chips in the Pages of 21st Century Books," *Popular Science,* 1997.

Wrighton et al., "Photoelectrolysis of Water by Irradiation of Platinized n–Type Semiconducting Metal Oxides" *Journal of Solid State Chemistry,* 1977, vol. 22, (pp. 17–29).

Yamaguchi et al., "Equivalent Circuit of Ion Projection––Driven Electrophoretic Display," *IEICE Transactions,* 1991, vol. 74, No. 12, (4152–4156).

Yang et al., "A New Architecture for Polymer Transistors," *Nature,* Nov. 1994, vol. 372, (pp. 344–346).

Zollinger, "Structure of Simple Di–and Triarylmethine Dyes," *Color Chemistry,* 1991, (pp. 73–75).

"Electronic Ink' Sign Debuts at JCPenney," *Boston Globe,* May 1999.

Flaherty, "What Did Disappearing Ink Grow Up to Be? Electronic Ink," *The New York Times,* May 1999.

Negroponte et al., "Surfaces and Displays," *Wired,* Jan. 1997, (p. 212).

Comiskey et al., "An Electrophoretic Ink for All–Printed Reflective Electronic Displays," *Nature,* Jul. 1998, vol. 394, (pp. 253–255).

Zurer, "Digital Ink Brings Electronic Books Closer," *Chemical,* Jul. 1998, (pp. 12–13).

Peterson, "Rethinking Ink Printing the Pages of an Electronic Book," *Science News,* Jun. 1998, vol., 153, (pp. 396–397).

Bao, "Soluble and Processable Regloregular Poly(3–Hexylthiophene) for Thin Film Field–Effect Transistor Applications with High Mobility," *Appl. Phys. Lett.,* Dec. 1996, vol. 69, No. 26, (pp. 4108–4110).

Bao et al., "High–Performance Plastic Transistors Fabricated by Printing Techniques," *Chem. Mater.,* 1997, vol. 9 No. 6 (pp. 1299–1301).

Dodabalapur, "Organic Smart Pixels," *American Institute of Physics,* 1998, (pp. 142–144).

Torsi et al., "Organic Thin–Film–Transistors with High on/off Ratios" *Materials Research Society Symp. Proc.,* 1996, vol. 377, (pp. 695–700).

Horowitz, "Organic Field–Effect Transistors," *Advanced Materials,* 1998, vol. 10, No. 5, (pp. 365–377).

McCullough, "The Chemistry of Conducting Polythiophenes," *Advanced Materials,* 1998, vol. 10, No. 2, (pp. 93–116).

Guernsey, "Beyond Neon: Electronic Ink," *New York Times,* Jun. 1999 (6 pages).

Yang, "The Investigation of Image Formation in a Large–Area Solid State X–Ray Receptor with Electrophoretic Display", *J. Appl. Phys.,* Sep. 1983, 54(9):4711–4721.

Hopper et al. (1979), "An Electrophoretic Display, Its Properties, Model and Addressing," *IEEE Transactions on Electron Devices,* 26(8):1148–1152.

White, "An Electrophoretic Bar Graph Display," *Proceedings of the SID,* 1981, 22(3):173–180.

Pansu et al. (1984), "Structures of Thin Layers of Hard Spheres: High Pressure Limit," *J. Physique,* 45:331–339.

Peiranski et al. (1983), "Thin Colloidal Crystals," *Physical Review Letters,* 50(12):900–903.

Pansu et al. (1983), "Thin Colloidal Crystals: A Series of Structural Transitions," *J. Physique,* 44:531–536.

Van Winkle et al. (1986), "Layering Transitions in Colloidal Crystals as Observed by Diffraction and Direct–Lattice Imaging", *Physical Review,* 34:562–573.

Anita (1999), "Switchable Reflections Make Electronic Ink", *Science,* 285:658.

Lee (1977), "Fabrication of Magnetic Particles Display," *Proceeding of the SID,* 18(3,4):283–288.

Quon, S. (1977), "Multilevel Voltage Select (MLVS): A Novel Technique to X–Y Address an Electrophoretic Image Display," *IEEE Transactions on Electron Devices,* 24(8): 1120–1123.

Chiang et al. (1979), "7.5/4:05 P.M.: A Stylus Writable Electrophoretic Display Device," *SID 79 Digest,* pp. 44–45.

* cited by examiner

ELECTROPHORETIC DISPLAYS AND SYSTEMS FOR ADDRESSING SUCH DISPLAYS

CROSS-REFERENCE TO RELATED APPLICATIONS

The present application claims priority to U.S. Ser. No. 60/078,363, filed Mar. 18, 1998 and U.S. Ser. No. 60/090,232, filed Jun. 22, 1998, the disclosures of which are hereby incorporated by reference herein.

FIELD OF THE INVENTION

The present invention relates to electrophoretic displays, especially encapsulated electrophoretic displays, and to systems for addressing such displays.

BACKGROUND OF THE INVENTION

There are a number of interesting display media which provide good optical appearance, the ability to be constructed in large areas or on flexible substrates, low cost, and ease of manufacture. Such display media include microencapsulated electrophoretic displays, rotating bichromal ball displays, suspended particle displays, and composites of liquid crystals with polymers, including polymer dispersed liquid crystals, polymer stabilized liquid crystals, and liquid crystal gels.

One drawback of such displays is that they are difficult to practically and economically address. One common means of addressing is known as direct drive addressing, in which each pixel is controlled by its own external drive circuit. This scheme is both expensive and impractical for displays containing a large number of pixels and for displays containing pixels that are tightly packed.

Another means of addressing is active matrix drive addressing, in which an electrically non-linear element is deposited on the display substrate. Examples of such electronically non-linear elements include transistors, diodes, and varistors. While this type of addressing is well-known and widely practiced, it is expensive to produce and difficult to achieve on plastic substrates.

A third means of addressing uses multiplexing, in which the conductive portions of the substrate are patterned so that rows of pixels on the substrate are electrically connected and columns of pixels on the substrate are also electrically connected. Typically, voltages are sequentially placed on the row electrodes, with the pixel data for each row being placed on the column electrode. This type of addressing is used for a variety of display media. Its use is limited, however, to displays in which the optical response as a function of applied voltage is non-linear and in which there is a significant voltage threshold to turn on the pixels. Display media which do not show a pronounced voltage threshold show poor contrast when driven with multiplex addressing drive schemes.

The purpose of this disclosure is to describe electrophoretic displays, especially encapsulated electrophoretic displays, and systems for addressing display media of such displays. Systems of the invention allow for the addressing of display media that have poor threshold behavior without the high costs associated with using direct drive and active matrix drive addressing schemes. This is accomplished by using a multiplex addressing drive scheme in conjunction with an emissive material that does possess a pronounced voltage threshold.

SUMMARY OF THE INVENTION

The present invention provides electrophoretic displays, especially encapsulated electrophoretic displays, and systems for addressing such displays. Displays of the invention include an organic, light-emitting layer, a photoconductive layer, and an electrophoretic layer. Such displays may be rigid or flexible. Displays of the invention may also include a reflective substrate to direct light from the organic, light-emitting layer to the photoconductive layer. Displays of the invention may also include a dielectrophoretic layer, which is preferably fenestrated. Finally, displays of the invention may also include a capacitor.

In one embodiment, the invention relates to an electrophoretic display including an organic, light-emitting layer, a photoconductive layer adjacent the organic, light-emitting layer, and an electrophoretic layer adjacent the photoconductive layer. Light from the organic, light-emitting layer strikes the photoconductive layer at a first point on a first side of the photoconductive layer, which faces the organic, light-emitting layer. A voltage is then generated at a second point on a second side of the photoconductive layer. This second point corresponds to the first point and faces the electrophoretic layer. The voltage at the second point addresses the electrophoretic layer at a predetermined point on the electrophoretic layer.

When the display is not illuminated, the impedance of the photoconductive layer is much greater than the impedance of the electrophoretic layer. The photoconductive layer therefore drops the majority of the applied voltage. When the display is illuminated, the impedance of the photoconductive layer decreases, and the majority of the applied voltage then drops across the electrophoretic layer, forming an image. Specifically, the photoconductive layer is biased at a voltage on the "rear" side, which faces the organic, light-emitting layer. The portions of the photoconductive layer that are exposed to light effectively transfer the voltage to the "front" side of the photoconductive layer, which faces the electrophoretic layer. Depending on the ratios of the capacitances and the resistances, the reset pulse may require a slow ramp to avoid the capacitive regime.

In another embodiment of the invention, an emissive display includes an organic, light-emitting layer and a photoconductive layer disposed under the organic, light-emitting layer. In this embodiment, the organic, light-emitting layer is addressable at a first predetermined voltage. A first fraction of this first predetermined voltage drops across the organic, light-emitting layer, and a second fraction of this first predetermined voltage drops across the photoconductive layer. When the organic, light-emitting layer is addressed using this first predetermined voltage, it emits light, which strikes the photoconductive layer. This light causes the impedance of the photoconductive layer to decrease, so that the fraction of the first predetermined voltage dropping across the photoconductive layer is decreased and the fraction of the first predetermined voltage dropping across the organic, light-emitting layer is increased. The organic, light-emitting layer may then be addressed at a second predetermined voltage, which is lower than the first predetermined voltage. In an alternative embodiment, the emissive display includes a fenestrated dielectrophoretic layer, which modulates the amount of light striking the photoconductive layer.

The organic, light-emitting layer for use in displays of the invention includes an organic material disposed on a clear substrate. The clear substrate may be a glass, a plastic, or a polyester substrate, for example. The organic, light-emitting material may be an organic compound, an organometallic compound, an oligomer, or a polymer. Dispersed within the organic material may be inorganic semiconductors, such as CdSe conductors, for example.

The photoconductive layer for use in displays of the invention includes a photoconductive material, such as 2,4,7-trinitro-9-fluorenone complexed with poly(N-vinylcarbazole). The photoconductive material may be an organic photoconductive polymer, a dye-aggregate photoreceptor, or a pigment-based photoreceptor. In one embodiment, the photoconductive layer is disposed on a clear substrate, such as a glass, a plastic, or a polyester substrate, for example. In one embodiment, an optical barrier layer is disposed over or adjacent to the photoconductive layer. The optical barrier layer is a dispersion of opaque conductive particles in a polymer matrix, such as a dispersion of black pigment particles in an epoxy binder, for example. In other embodiments, the photoconductive layer includes a first photoconductive material and a second photoconductive material. The second photoconductive material is sensitive to a different variable of light than the first photoconductive material. The variable of light may be the wavelength of the light, the intensity of the light, or the duration of the light.

The electrophoretic layer for use in displays of the invention may be an encapsulated electrophoretic layer or a dielectrophoretic layer. An encapsulated electrophoretic layer of the invention includes a plurality of particles dispersed in a suspending fluid, which is encapsulated in a polymer matrix. The polymer matrix may include an aqueous polymer latex, such as a polyurethane, for example. The polymer matrix may be coated onto a substrate, such as a glass, plastic, or polyester substrate, for example.

In another embodiment of the invention, a display includes a clear top electrode. This clear top electrode may comprise a conductive material on a substrate. The clear top electrode may be indium tin oxide (ITO) coated onto a glass, plastic, or polyester substrate, for example.

The invention will be understood further upon consideration of the following drawings, description, and claims.

BRIEF DESCRIPTION OF THE DRAWINGS

Like reference characters in the drawings represent corresponding parts.

DETAILED DESCRIPTION OF THE INVENTION

The invention relates to electrophoretic displays, especially encapsulated electrophoretic displays, and to systems for addressing such displays. Generally, an electrophoretic display of the invention includes a light-emitting layer, a photoconductive layer, and an electrophoretic layer. The light-emitting layer is preferably an organic, light-emitting material, such as an organic compound, an organometallic compound, an oligomer, or a polymer, for example. The photoconductive layer is preferably an organic conductive polymer, a dye-aggregate photoreceptor, or a pigment-based photoreceptor. The light-emitting layer and the photoconductive layer are both preferably disposed on a clear substrate, such as a glass, plastic, or polyester substrate, for example. The electrophoretic layer may be an encapsulated electrophoretic layer or a dielectrophoretic layer, for example. Displays of the invention may also include a dielectrophoretic layer, which is preferably fenestrated. Displays of the invention may be either rigid or flexible. Finally, displays of the invention may include at least one capacitor.

Displays of the invention provide for the use of a multiplexed drive scheme to address the display. In the below described embodiments of the invention, the light-emitting layer is addressed using a multiplex addressing drive scheme. The impedance of the photoconductive layer is lowered when it is struck by light from the light-emitting layer. As a result of the lowered impedance of the photoconductive layer, the electrophoretic layer, which itself cannot be multiplexed, is addressed at a lower, subthreshold voltage in dark regions of the display and at a higher voltage in the illuminated regions of the display.

The present invention provides novel combinations of emissive materials and electrophoretic display materials to provide the effective multiplexed addressing of the electrophoretic display. In particular, organic, light-emitting materials, which have not been previously described in optical addressing of electrophoretic displays, are described as the multiplexed emissive materials. Additionally, the use of emissive materials in this manner extends the number of organic emissives that are practical for a number of applications. Finally, applications of these materials on flexible substrates, which are useful in larger-area, low cost, or high-durability applications, is also described. Electrophoretic displays of the invention are described below.

Figure 1:
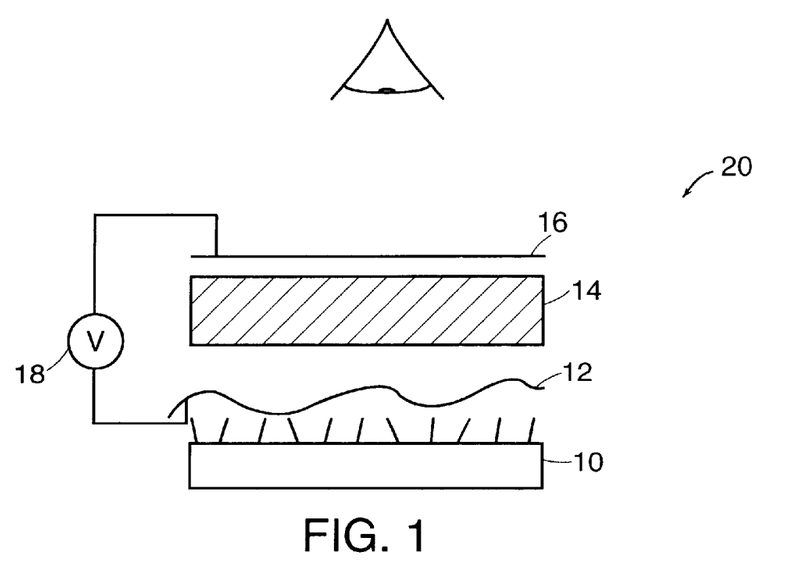
FIG. 1 shows a display of the invention.

FIG. 1 shows a display of the invention. The display 20 includes light-emitting layer 10, photoconductive layer 12, electrophoretic layer 14, clear top electrode 16, and a source of voltage 18. In one embodiment, the clear top electrode 16 is a glass, plastic, or polyester substrate coated with indium tin oxide (ITO). In the embodiment shown in FIG. 1, a large voltage is placed on the photoconductive layer 12 relative to the electrophoretic layer 14, so that the photoconductive layer 12 essentially serves as one electrode of the display 20. When no light strikes the photoconductive layer 12, the voltage drops primarily across the photoconductive layer 12 (i.e., no voltage on the electrophoretic layer 14). When light strikes the photoconductive layer 12, however, voltage drops across the electrophoretic layer 14, and the electrophoretic layer 14 is addressed.

Electrophoretic layers for use in displays of the invention are preferably encapsulated electrophoretic layers, but other electrophoretic layers are contemplated by the invention. Such layers include dielectrophoretic layers, addressable retroreflective layers, and micro-mechanical, micro-mirror, or other light-directing layers, as well as layers in which the optical effect is achieved by translating various liquids of differing dielectric constants (i.e., suspended liquid displays). The electrophoretic layer may also be a classic emissive, transmissive, or transflective display material. Furthermore, the electrophoretic layer may be nematic liquid crystals in a variety of modes (e.g., tunable birefringence, twisted nematic, or vertically-aligned nematic), polymer dispersed liquid crystals, ferroelectric liquid crystals, or standard electrophoretic displays on glass. (See, e.g., "High Resolution Display with Photoconductor Addressing" by Stephen Blazo, *SID Digest Technical Papers* 1982, pp. 92–93). Such displays, while effective, are, however, typically expensive to produce and/or are limited to use in small areas.

An encapsulated electrophoretic layer of the invention, preferably contains particles in a suspending fluid. In some embodiments of the invention, at least one species of particles are titania particles or other particles of high refractive index such as clays. In other embodiments of the invention, at least one species of particles responds to heat, fluorescent light, magnetic field, or other phenomena, and releases light.

Referring again to FIG. 1, if the electrophoretic layer 14 has a low conductivity (i.e., the particles are the primary charge carriers), the particles are brought to one electrode by the application of a high voltage, while the photoconductive layer 12 is kept dark. Alternatively, if the electrophoretic layer 14 has a high conductivity (i.e., there are a large number of free ions), the particles are brought to one electrode by the application of a high voltage and the entire display is illuminated. Once the particles are on one side or the other of the display, they will remain attached to the wall of the electrophoretic layer 14 (i.e., the display is bistable). The voltage is then reversed by ramping very slowly to the opposite polarity. If the electrophoretic layer 14 has a low conductivity, this ramping may be done in the dark. If the electrophoretic layer 14 has a high conductivity, this ramping must be done in the dark. In either case, the particles do not move as long as the slowly ramping voltage across the electrophoretic layer 14 is kept under the threshold voltage by the movement of free ions in the electrophoretic layer 14. With the voltage remaining on, the photoconductive layer 12 is illuminated image-wise. The particles then move to the opposite electrode in the regions of the electrophoretic layer 14 that are adjacent to the illuminated regions of the photoconductive layer 12.

In an alternative embodiment of the display of FIG. 1, the light-emitting layer 10 is addressed using an active matrix addressing scheme. The emission from the light-emitting layer 10 then addresses the electrophoretic layer 14, mediated by the photoconductive layer 12. The advantage here is that the light-emitting layer 10 can be driven at low voltages and with low power, as is compatible with active matrix devices. Some implementations of the displays described herein require high voltages, which are incompatible with active matrix electronics. This embodiment therefore provides a system in which a low voltage active matrix panel drives a high voltage display medium, mediated by the light-emitting layer 10 and the photoconductive layer 12.

Light-emitting layers for use in displays of the invention are preferably an organic, light-emitting material (i.e., an organic, light-emitting diode, or OLED) disposed on a clear substrate. The substrate may be a glass, plastic, or polyester substrate. Organic, light-emitting materials, or OLEDs, for use in displays of the invention include organic compounds, organometallic compounds, oligomers, and polymers. Examples of organic materials that may be useful in the invention include, but are not limited to, tris-(8-hydroxyquinoline) aluminum (Alq3), N,N'-bis-(1-naphyl)-N,N'-diphenyl-1,1'-biphenyl-4,4'-diamine (NPB), poly[2,5-bis[2-(N,N,N-triethylammonium)ethoxy]-1,4-phenylene-alt-1,4-phenylene]dibromide (PPP-NEt$_3^+$)[5], and poly(5-methoxy-(2-propanoxysulfonide)-1,4-phenylene vinylene) (MPS-PPV). In one embodiment, the organic, light-emitting layer is a multi-layer composition. For example, the organic, light-emitting layer may be a composition of ITO/copper phthalocyanine/NPB/8-hydroxyquinoline aluminum/Mg. Additionally, composites of such organic materials may be used as the organic, light-emitting layer, such as MPS-PPV doped PPP-NEt$_3^+$, for example. Other organic, light-emitting materials that may be useful in the invention are not formally diodes. Such materials work by the formation of dynamic p-n junctions or by other processes, such as chemiluminescence, for example. The light-emitting materials described herein include these and related materials.

Organic, light-emitting materials for use in the invention may also include dispersions or layers of inorganic semiconductors. Such inorganic semiconductors include, but are not limited to, CdSe. The devices may have multiple layers, including electron-injecting electrodes, electron transport layers, emissive layers, hole transporting layers, and hole-injecting electrodes.

One drawback of organic, light-emitting materials is their relatively short lifetimes, particularly when operated to produce light. In particular, the organic, light-emitting material tends to degrade unless water and oxygen are excluded. For this reason, the organic light-emitting material may be protected from exposure to water and oxygen by a barrier layer disposed over the organic, light-emitting material.

In addition to organic, light-emitting materials, other light-emitting materials may be useful in the invention. Suitable light-emitting materials include, but are not limited to, transmissive materials, lasers, slide projectors, inorganic, light-emitting diodes, cathode ray tubes, and incandescent, fluorescent, infrared, or neon bulbs. Similarly, the light-emitting layer may be a microwave, radio frequency, or X-ray device, or any other device or material that creates, either directly or through suitable means, sufficient wavelength energy to cause an electrical response by an appropriately sensitive mediator. The light-emitting material may also be an electroluminescent material, such as ZnS dispersed in a polymer matrix, for example.

Photoconductive materials for use in displays of the invention include organic photoconductive polymers, dye-aggregate photoreceptors, and pigment-based photoconductors. In some embodiments of the invention, it may be advantageous to construct a two-layer photoconductive material in which the charge-generation and charge-transport layers are separate (i.e., a dual-layer configuration). Photoconductive materials for use in displays of the invention are preferably organic photoconductive polymers. An example of an organic photoconductive polymer is 2,4,7-trinitro-9-fluorenone complexed with poly (N-vinylcarbazole). For pigment-based photoconductors, the pigment particles themselves may be photoconductive, so that the photoactive and optically active components are the same.

Examples of photoconductive materials that may be useful in displays of the invention are disclosed in Pan, et al., U.S. Pat. No. 4,439,507, which is hereby incorporated by reference herein. Examples of photoconductive materials include inorganic and organic photoconductive materials, layered photoconductive materials having inorganic or organic compositions, and composite layered devices containing photoconductive materials in a polymer matrix. One example of a composite layered device is a dispersion of zinc oxide particles in a polymer matrix. Useful polymer matrices include those which are incapable of transporting for any significant distance injected charge carriers generated by the photoconductive material. Such useful polymer matrices include, but are not limited to, polystrene resins, silicone resins, acrylic and methacrylic ester polymers, polymerized ester derivatives of acrylic and α-acrylic acids, chlorinated rubber, vinyl polymers and copolymers, and cellulose esters. Other known photoconductive materials include amorphous selenium, halogen doped amorphous selenium substances, amorphous selenium alloys, including selenium arsenic, selenium tellurium, selenium arsenic antimony, halogen doped selenium alloys, wherein the halogen is a material such as chlorine, iodine, or fluorine, cadmium sulfide, and the like. Generally, these photoconductive materials are deposited on a suitable clear substrate, such as a glass, plastic, or polyester substrate.

Depending on their construction, photoconductive materials are tuned in sensitivity to different portions of the infrared, visible, and ultraviolet spectrum. A photoconductive material for use in a display of the invention preferably has an absorption activity that is substantially matched to the emissive wavelength range of the particular organic, light-emitting material being used in that display. The wavelength sensitivity of the photoconductor is dependent on the composition of the charge generator. For example, if the charge generator is primarily selenium alloys, the photoconductive material is most sensitive to blue light near the 400 nm wavelength range. Alternatively, if the charge generator is mainly phthalocyanine pigments, the photoconductive material is most sensitive to red light near the 700 nm wavelength range.

Figure 2:
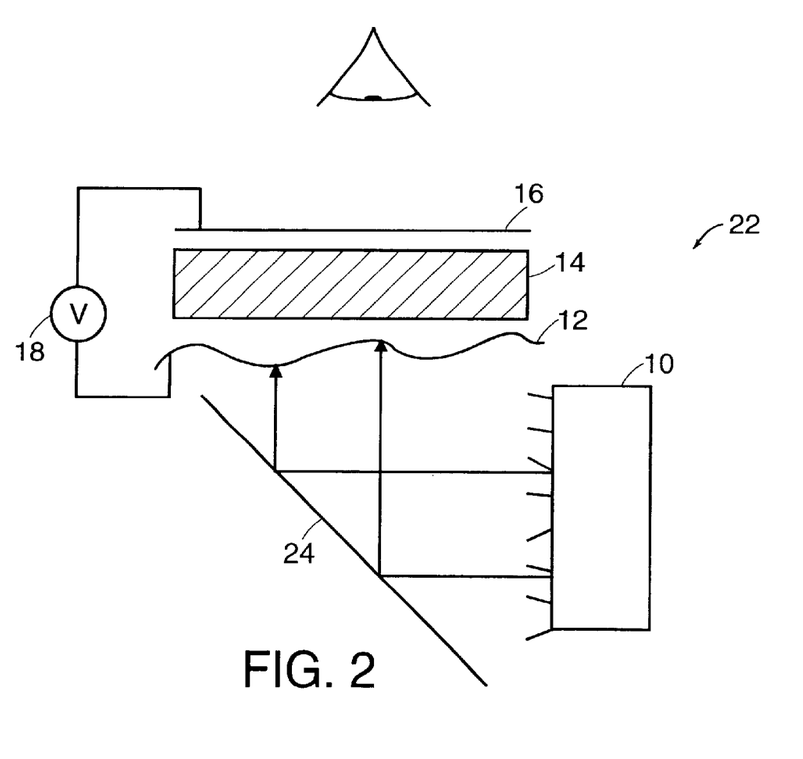
FIG. 2 shows a display of the invention containing a reflective substrate for directing light from an emissive layer to a photoconductive layer.

While the invention shown in FIG. 1 generally describes a light-emitting layer 10 directly behind the electrophoretic layer 14 and photoconductive layer 12, the light source can also be in front, to the side, or offset from the electrophoretic layer or photoconductive layer. One such example is shown in FIG. 2. FIG. 2 shows a display 22 having a light-emitting layer 10 offset to the right of, and on a different plane from, the photoconductive layer 12 and the electrophoretic layer 14. Mirror 24 serves to direct light from the light-emitting layer 10 to the photoconductive layer 12. In alternative embodiments, the light is conveyed by light pipe, mirror, fiber optic assembly, or other light-transmitting methods. Similarly, in another alternative embodiment, the electrical properties of the photoconductive layer 12 are conveyed to the electrophoretic layer 14 by various connecting conductors or otherwise conductive layers.

The embodiment of the invention shown in FIG. 1 has many benefits over traditional displays. For example, the light-emitting layer 10 and the electrophoretic layer 14 are opto-isolated, making the display 20 more tolerant of surges and spikes in the drive electronics than would be true if the drive electronics were connected directly. Furthermore, when the display 20 is bistable, the display need only operate during the switching period and is otherwise deactivated. During the switching period, even a small amount of light is sufficient to activate certain photoconductors. Thus, the display operates with reduced power consumption and improved lifetime compared to a standalone emissive display. Finally, in this embodiment of the invention, favorable lower-voltage addressing characteristics of the light-emitting layer 10 are utilized by the electrophoretic layer 14. The display 20 therefore provides for the use of cheaper low-voltage drivers to address a high-voltage display.

Figure 3:
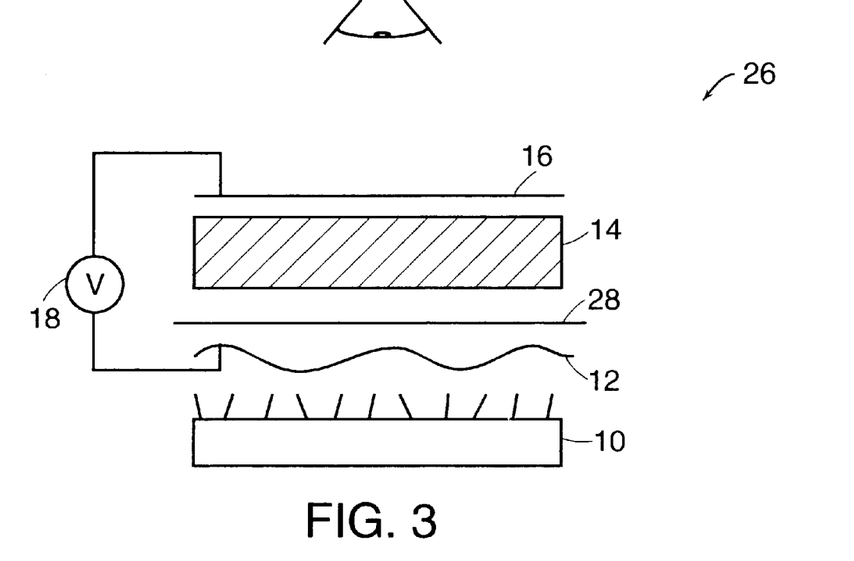
FIG. 3 shows a display of the invention containing a light-blocking layer.

FIG. 3 shows another display of the invention. The display 26 includes light-emitting layer 10, photoconductive layer 12, optical barrier layer 28, electrophoretic layer 14, a clear top electrode 16, and a source of voltage 18. Electrophoretic layers are naturally highly light blocking, since they are designed to have a high contrast between the two states. Many photoconductive layers, on the other hand, are highly sensitive to light, so that even a little light leaking through the electrophoretic layer 14 is sufficient to render the photoconductive layer 12 conductive. In this case, an optical barrier layer 28 is inserted between the electrophoretic layer 14 and the photoconductive layer 12. As described above, an optical barrier layer 28 may be a dispersion of black pigment particles in an epoxy binder, for example. This optical barrier layer 28 also conducts a charge from the photoconductive layer 12 to the electrophoretic layer 14. The conductivity of the optical barrier layer 28 must, however, be low enough to prevent most of the lateral charge flow. This is usually accomplished by making the optical blocking layer 28 as thin as possible.

Figure 4:
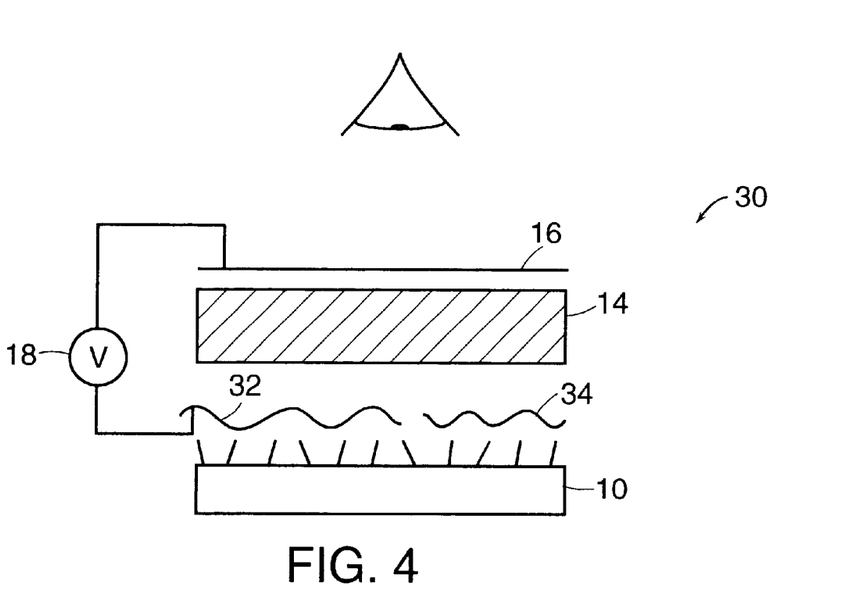
FIG. 4 shows a display of the invention containing two different types of photoconductive materials.

In other embodiments of the invention, the photoconductive layer may or may not be optically responsive in a uniform manner across the entire display or a pixel of the display. By creating sub-pixel regions in which the photoconductive layer differs, varying optical effects are achieved. On such example is shown in FIG. 4. FIG. 4 shows a display 30 containing a light-emitting layer 10, a first photoconductive material 32, a second photoconductive material 34, an electrophoretic layer 14, a clear top electrode 16, and a source of voltage 18. Each of the first and second photoconductive materials is sensitive to a different variable of light. The variable may be the wavelength of the light, the intensity of the light, or the duration of the light. By varying, for example, the wavelength of light from the light-emitting layer 10, different sub-pixel regions of the electrophoretic layer 14 are addressed.

The embodiment as shown in FIG. 4 may have a varying number of sub-pixel regions and different photoconductive materials in order to provide grayscale or color displays. For example, a pixel is split into four sub-pixels with each sub-pixel having a photoconductive material sensitive to, for example, varying levels or durations of light. A single underlying light-emitting layer actuates one, two, three, or four of the sub-pixel regions, and thereby achieves four-bit grayscale. In this manner, a grayscale emissive display drives a grayscale electrophoretic display. Similarly, in another example, the various sub-pixel regions correspond to varying colors. In this manner, a grayscale emissive display drives an electrophoretic layer capable of different colors without requiring separate addressing for each of the color sub-pixel regions.

In another embodiment, photoconductive layer sub-regions are tuned to respond to varying frequencies of light. A single pixel is therefore capable of generating multiple frequencies of light, which actuate multiple individual overlying pixels or sub-pixels. This permits an emissive display of one resolution to successfully address a second display at a higher resolution.

Figure 5:
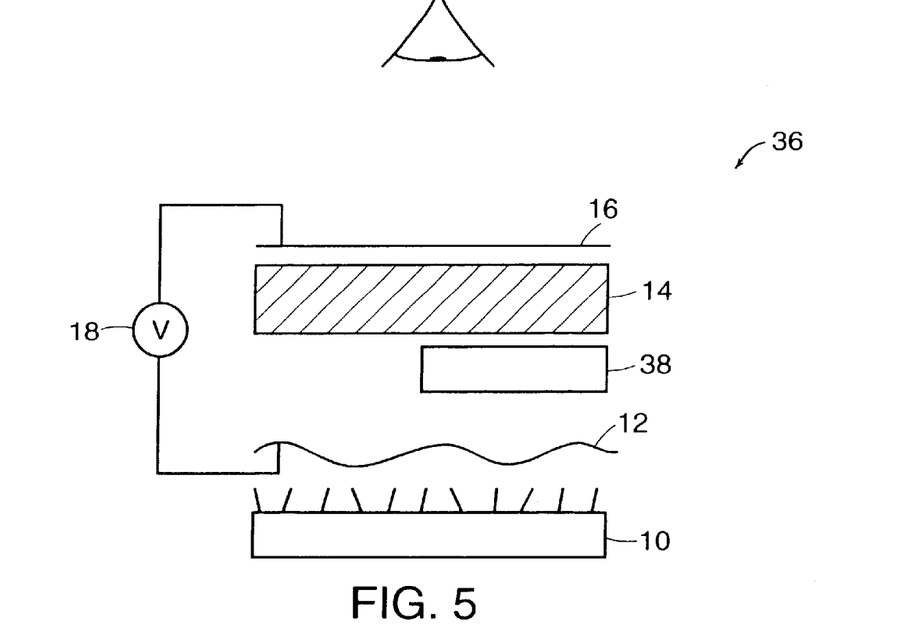
FIG. 5 shows a display of the invention containing a capacitor.

In the embodiment shown in FIG. 5, a printed capacitor or printed region of conductive material, is interposed between the photoconductive layer and the electrophoretic layer. As shown in FIG. 5, the display 36 contains a light-emitting layer 10, a photoconductive layer 12, a capacitor 38, an electrophoretic layer 14, a clear top electrode 16, and a source of voltage 18. As shown in the figure, the capacitor 38 is located beneath only a portion of, or beneath one of the two sub-pixels of, the electrophoretic layer 14. Since the capacitor is beneath one sub-pixel and not another, a brief drop in voltage across both sub-pixels actuates only one of the sub-pixels.

The embodiment of FIG. 5 may be combined with that of FIG. 4 to achieve further addressing systems. For example, if the sub-pixel lacking a capacitor is addressed by a first photoconductive layer requiring a high intensity of light for activation, whereas the sub-pixel with a capacitor is addressed by a second photoconductive layer that activates at low intensities of light, the first sub-pixel, but not the second, is actuated with a short pulse of intense light. The second sub-pixel, but not the first sub-pixel, is actuated with a long pulse of low-intensity light. Furthermore, both sub-pixels are actuated with a long pulse of high-intensity light. This again would permit an emissive display of one resolution to successfully address a second display at a higher resolution.

While the invention disclosed above generally describes an electrophoretic layer that covers a photoconductive layer, that in turn covers a light-emitting layer, the various layers can also be applied with partial coverage to achieve various effects. For example, the pixels of the electrophoretic layer may have sub-pixel regions. In one embodiment shown in FIG. 6, the display 40 contains sub-pixel region 42, which is a bistable electrophoretic material, behind which is a first photoconductive material 44. Behind the photoconductive material 44 is a light-emitting layer 10 that is addressed using a multiplex addressing drive scheme. In another sub-pixel region, a second photoconductive material 46, which is affected by a different wavelength, higher intensity, or duration of light, is open to ambient light from the front. This second photoconductive material 46 may or may not be electrically connected with the sub-pixel region 42. Light from an external source is therefore used to address the entire display. Such a display could, for example, be used for white board, which is electronically addressable from behind, as well as addressable by a user standing in front holding a laser pointer or by a projective display.

Figure 6:
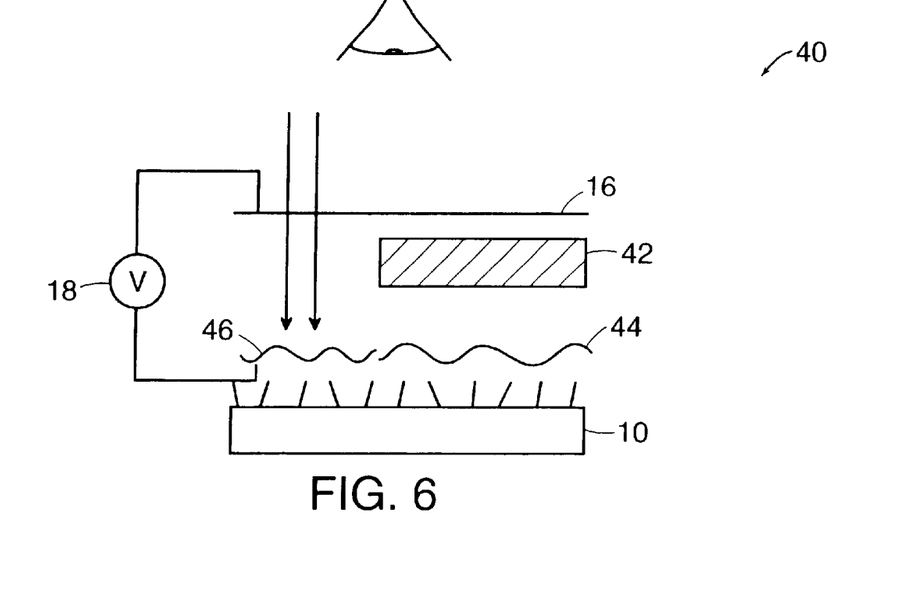
FIG. 6 shows a display of the invention containing a partial electrophoretic layer.

In an alternative embodiment of the invention shown in FIG. 6, the light-emitting layer 10 is open at the rear and is addressed via direct drive or active matrix drive addressing schemes, or by electrostatic print head. An electrical change in the light-emitting layer 10 either causes an optical response across the corresponding sub-pixel of the display or, by electrical connection, causes an optical response across the entire pixel. In this manner, a billboard is not only matrix addressed at a coarser resolution, but also addressed at higher resolutions by an alternative drive scheme. For example, with a suitably shaped additional electrode layer, the billboard displays a giant logo in detailed resolution and then alternates with a variable message display. Alternatively, an electrostatic print head updates one part of the billboard with extremely high resolution, while the remainder of the display is animated or updated at coarser resolution on a frequent or rotating basis.

Another alternative embodiment includes a sub-pixel containing a photoconductive layer that is optically open from the rear. Again, this photoconductive layer addresses only the sub-pixel immediately above it. If the photoconductive layer is connected by electrical or optical connection to the entire pixel, the entire pixel is addressed. In this manner, a billboard is addressed via matrix addressing, as well as by a laser projector that rasterizes across the rear or by a slide projector that projects onto the display.

Figure 7:
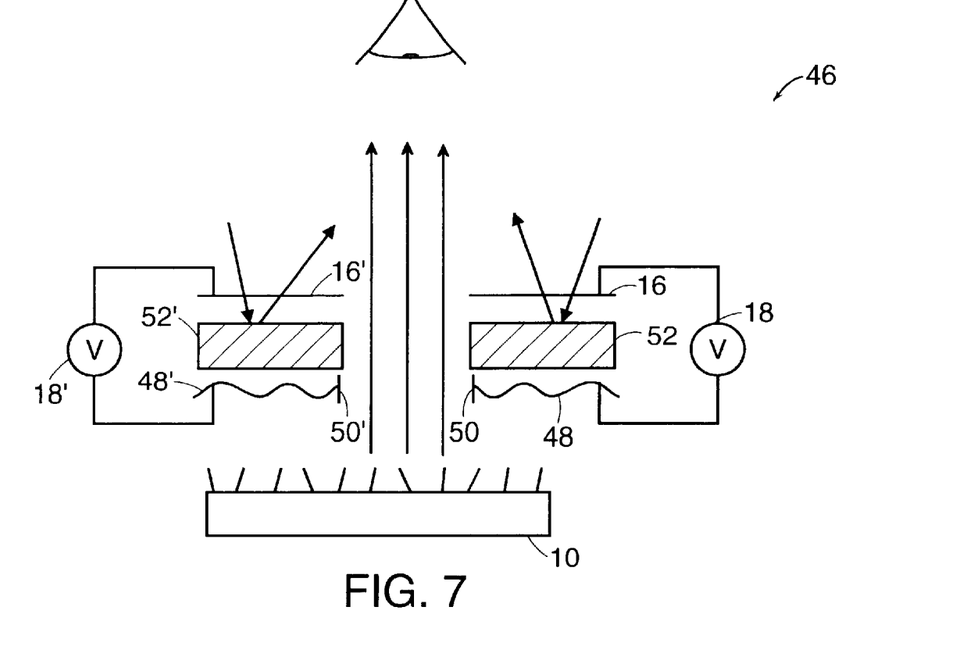
FIG. 7 shows a display of the invention containing partial electrophoretic and photoconductive layers, as well as a light-blocking material.

In another embodiment shown in FIG. 7, the display 46 contains a hole or clear region through which light from the emissive portion of the display is visible. The display 46 contains a light-emitting layer 10, photoconductive layers 48 and 48', optical barrier layers 50 and 50', electrophoretic layers 52 and 52', clear top electrodes 16 and 16', and sources of voltage 18 and 18'. In this manner, an outdoor display could be constructed which either emits light through the opening between the electrophoretic layers 52 and 52' or operates in a reflective mode with light being emitted from the electrophoretic layers 52 and 52' as they are addressed. The optical barrier layers 50 and 50' prevent external light from striking the photoconductive layers 48 and 48' and thereby addressing the display 46. Alternatively, the display 46 uses the same addressing method for both types of emission.

In alternative embodiments of the display shown in FIG. 7, a fenestrated layer is used to control the amount of ambient light striking the photoconductive materials. Alternatively, an external laser, stylus or projected light source addresses the display by transmitting straight through the electrophoretic layer at a frequency that activates a photoconductive material that is sensitive to that frequency. By tuning the laser to a certain frequency and by driving the photoconductive layer with voltage in a synchronized manner, the display's exposure to unwanted ambient light at the chosen frequency is reduced. In another alternative embodiment, the addition of an optical filter or a light-modulating layer, such as a photochromic material, affects the amount of light striking the photoconductive layer.

Figure 8:
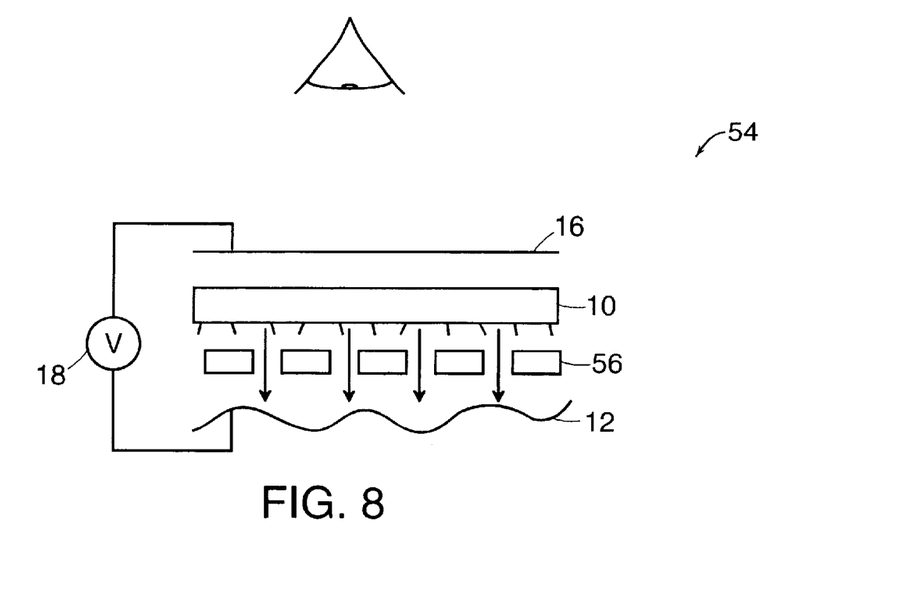
FIG. 8 shows a display of the invention containing a photoconductive layer, an organic, light-emitting layer, and a fenestrated dielectrophoretic layer.

In another embodiment, as shown in FIG. 8, a display 54 includes light-emitting layer 10, fenestrated dielectrophoretic layer 56, photoconductive layer 12, clear top electrode 16, and a source of voltage 18. The display 54 is multiplexed, with select and non-select voltages being applied to the rows and the data being applied to the columns. The voltage in non-selected rows is chosen such that, with the dark impedance of the photoconductive layer 12, the voltage drop across the light-emitting layer 10 is insufficient to address the light-emitting layer 10 independent of the data on that column. When a pixel is turned on by being in a selected row at the appropriate data voltage, the light-emitting layer 10 emits light. The light travels through the fenestrated dielectrophoretic layer 56 and strikes the photoconductive layer 12, thereby reducing the impedance of the photoconductive layer 12. In an alternative embodiment, the addition of an optical filter or a light-modulating layer, such as a photochromic material, affects the amount of light striking the photoconductive layer. The reduction in impedance causes the voltage drop across the photoconductive layer 12 to decrease, which in turn causes the non-select voltage (which is then applied to that row as other rows are addressed) to drop across the light-emitting layer 10. This non-select voltage drop is sufficient to "latch" the pixel on. A threshold voltage is, therefore, initially required to address the display 54. After light from the light-emitting layer 10 operates to lower the impedance of the photoconductive layer 12, a lower threshold voltage is required to maintain the display 54 in the illuminated state.

Figure 9:
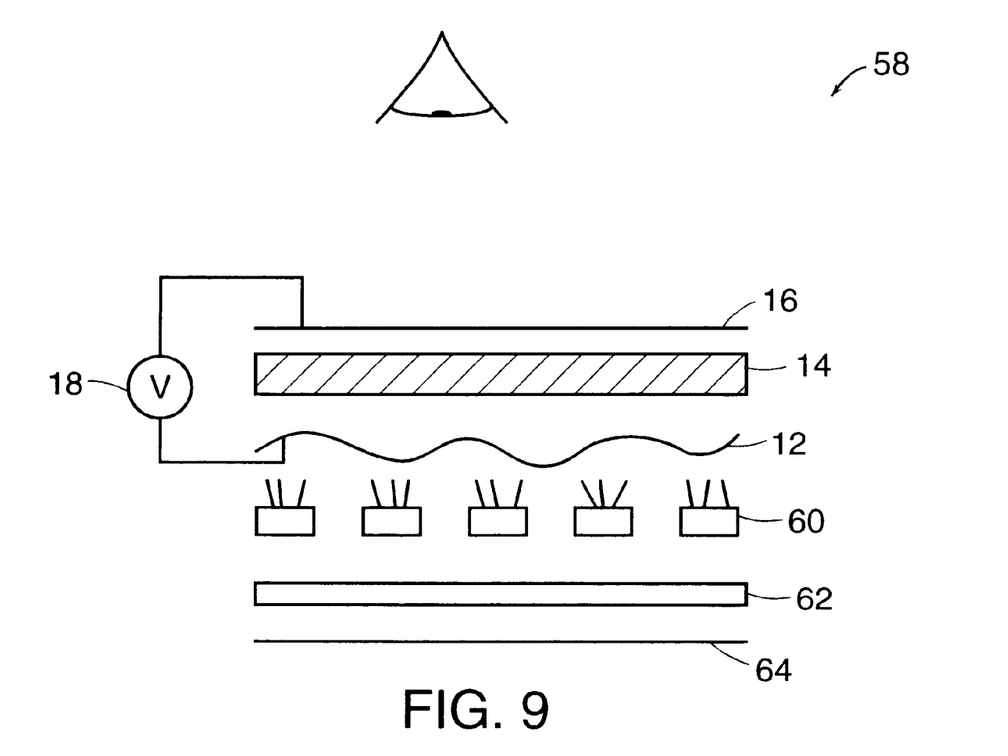
FIG. 9 shows a display of the invention containing a light-directing layer and a spacer layer so as to generate an image based on an external reflective surface.

FIG. 9 shows an embodiment of the invention in which an external paper document is used to generate an image. The display 58 of this embodiment includes paper document 64, light diffusor 62, fenestrated light-emitting layer 60, photoconductive layer 12, electrophoretic layer 14, clear top electrode 16, and a source of voltage 18. Light diffusor 62 is optional to the display 58 and may also be embodied as a clear spacer. Paper document 64 is any external object having a reflective surface containing both areas of light appearance and areas of dark appearance. In the embodiment of FIG. 9, the fenestrated light-emitting layer 60 bounces light through the light diffusor 62, which may, for example, focus, diffuse or change the angle of incidence of the light, and to the document 64. The light is then reflected more from lighter areas than from the darker areas of the document 64. The reflected light from the lighter areas of document 64 thereby activates those regions of photoconductive layer 12 that correspond to the reflected regions of the document 64. In this manner, a display that can be placed against any document, or reflective surface, and images itself with high resolution in the same form as the document, is constructed. The effect is further enhanced when the electrophoretic display is bistable and when the entire display is flexible. Thus, this invention provides for a paper-like display that can copy an image directly from a document. In a preferred embodiment, the light-emitting layer does not require an addressing matrix, because information content is translated wholly from the external reflective surface.

Displays of the invention are also preferably flexible. The display materials may, for example, be printed onto thin, flexible substrates. Such substrates may include pliable, plastics, polymeric films, metal foils, and thin glass, for example.

The invention therefore provides for the combination of light-emitting, photoconductive, and electrophoretic materials in a display that is addressable using a multiplex addressing drive scheme. Such a combination permits construction of cheap, low-power, bistable, and fast-switching, yet high-resolution, displays. Such displays are uniquely suited for flexible, curved, and contoured handheld applications, as well as for large-areas, such as billboards, due to their all-printed construction. Practical applications of such displays include portable electronics, such as pagers, cellular telephones, notebook computers, personal digital assistants, etc., large area displays for signs, advertising, and informational purposes, wearable displays, displays on appliances, displays on non-portable electronic devices, electronic paper, electronic newspapers, and electronic books.

Electrophoretic displays and systems for addressing such displays are therefore described. Additional aspects and advantages of the invention are apparent upon consideration of the foregoing. Accordingly, the scope of the invention is limited only by the scope of the appended claims.

What is claimed is:

1. An electrophoretic display, comprising:
   (a) an organic, light-emitting layer;
   (b) a photoconductive layer adjacent said organic, light-emitting layer; and
   (c) an electrophoretic layer adjacent said photoconductive layer, wherein light from said organic, light-emitting layer reduces an impedance of said photoconductive layer, permitting an applied electric field to address said electrophoretic layer at a predetermined point on said electrophoretic layer.

2. The display of claim 1, wherein said organic light-emitting layer comprises an organic material disposed on a clear substrate.

3. The display of claim 2, wherein said clear substrate is selected from the group consisting of a glass substrate, a plastic substrate, and a polyester substrate.

4. The display of claim 2, wherein said organic material is selected from the group consisting of organic compounds, organometallic compounds, oligomers and polymers.

5. The display of claim 2, wherein said organic material is tris-(8-hydroxyquinoline) aluminum.

6. The display of claim 2, wherein said organic material further comprises a dispersion of inorganic semiconductors.

7. The display of claim 6, wherein said inorganic semiconductors are CdSe.

8. The display of claim 1, wherein said light-emitting layer comprises an electroluminescent layer.

9. The display of claim 8, wherein said electroluminescent layer comprises a dispersion of ZnS particles in a polymer binder disposed on a clear substrate.

10. The display of claim 9, wherein said clear substrate is selected from the group consisting of a glass substrate, a plastic substrate, and a polyester substrate.

11. The display of claim 1, wherein said photoconductive layer comprises a photoconductive material disposed on a clear substrate.

12. The display of claim 11, wherein said clear substrate is selected from the group consisting of a glass substrate, a plastic substrate, and a polyester substrate.

13. The display of claim 11, wherein said photoconductive material is selected from the group consisting of organic photoconductive polymers, dye-aggregate photoreceptors, and pigment-based photoconductors.

14. The display of claim 11, wherein said photoconductive material is 2,4,7-trinitro-9-fluorenone complexed with poly(N-vinylcarbazole).

15. The display of claim 1, wherein said photoconductive layer comprises a first photoconductive material and a second photoconductive material, said first photoconductive material being sensitive to a different variable of light than said second photoconductive material.

16. The display of claim 15, wherein said variable of light is selected from the group consisting of a wavelength of said light, an intensity of said light, and a duration of said light.

17. The display of claim 1, wherein said electrophoretic layer is selected from the group consisting of an encapsulated electrophoretic layer and a dielectrophoretic layer.

18. The display of claim 17, wherein said encapsulated electrophoretic layer comprises a plurality of particles dispersed in a suspending fluid and encapsulated in a polymer matrix.

19. The display of claim 1, further comprising a dielectrophoretic layer disposed adjacent said photoconductive layer.

20. The display of claim 1, further comprising a reflective substrate for directing light from said organic, light-emitting layer to said photoconductive layer.

21. The display of claim 1, further comprising a capacitor disposed adjacent said photoconductive layer.

22. The display of claim 1, wherein said display is flexible.

23. The display of claim 1, further comprising a clear electrode in electrical communication with said photoconductive layer.

24. The display of claim 23, wherein said clear electrode comprises a clear substrate coated with indium tin oxide.

25. The display of claim 1, further comprising an optical barrier layer disposed over said photoconductive layer for blocking a quantity of light from at least a portion of said photoconductive layer.

26. The display of claim 25, wherein said optical barrier layer comprises a dispersion of opaque conductive particles in a polymer matrix.

27. An emissive display, comprising:
   (a) an organic, light-emitting layer addressable at a first predetermined voltage, a first fraction of said first predetermined voltage dropping across said organic, light-emitting layer; and
   (b) a photoconductive layer disposed under said organic, light-emitting layer, a second fraction of said first predetermined voltage dropping across said photoconductive layer, wherein light from said organic, light-emitting layer strikes said photoconductive layer, thereby lowering an impedance of said photoconductive layer and thereby reducing said second fraction of said voltage and thereby increasing said first fraction of said voltage, whereby said organic, light-emitting layer is subsequently addressable at a second predetermined voltage, said second predetermined voltage being lower than said first predetermined voltage.

28. The display of claim 27, further comprising a fenestrated dielectrophoretic layer disposed between said organic, light-emitting layer and said photoconductive layer, said fenestrated dielectrophoretic layer for modulating an amount of light striking said photoconductive layer.

29. The display of claim 27, wherein said organic, light-emitting layer comprises an organic material disposed on a clear substrate.

30. The display of claim 29, wherein said clear substrate is selected from the group consisting of a glass substrate, a plastic substrate, and a polyester substrate.

31. The display of claim 29, wherein said organic material is a material selected from the group consisting of organic compounds, organometallic compounds, oligomers, and polymers.

32. The display of claim 29, wherein said organic material is tris-(8-hydroxyquinoline) aluminum.

33. The display of claim 30, wherein said organic material further comprises a dispersion of inorganic semiconductors.

34. The display of claim 33, wherein said inorganic semiconductors are CdSe.

35. The display of claim 27, wherein said photoconductive layer comprises a photoconductive material disposed on a clear substrate.

36. The display of claim 35, wherein said clear substrate is selected from the group consisting of a glass substrate, a plastic substrate, and a polyester substrate.

37. The display of claim 35, wherein said photoconductive material is selected from the group consisting of organic photoconductive polymers, dye-aggregate photoreceptors, and pigment-based photoconductors.

38. The display of claim 35, wherein said photoconductive material is 2,4,7-trinitro-9-fluorenone complexed with poly(N-vinylcarbazole).

39. The display of claim 27, further comprising a clear electrode in electrical communication with said photoconductive layer.

40. The display of claim 39, wherein said clear electrode comprises a clear substrate coated with indium tin oxide.

41. The display of claim 40, wherein said clear substrate is selected from the group consisting of a glass substrate, a plastic substrate, and a polyester substrate.

42. The display of claim 27, wherein said display is flexible.

* * * * *

UNITED STATES PATENT AND TRADEMARK OFFICE
CERTIFICATE OF CORRECTION

PATENT NO. : 6,445,489 B1
DATED : September 3, 2002
INVENTOR(S) : Jacobson et al.

It is certified that error appears in the above-identified patent and that said Letters Patent is hereby corrected as shown below:

Column 13,
Line 25, please delete "claim 30," and insert in its place -- claim 29 --.

Signed and Sealed this

Eighth Day of June, 2004

JON W. DUDAS
*Acting Director of the United States Patent and Trademark Office*